United States Patent [19]

Eidschun

[11] 4,427,019
[45] Jan. 24, 1984

[54] CHEMICAL PROCESS APPARATUS

[75] Inventor: Charles D. Eidschun, Clearwater, Fla.

[73] Assignee: Micro-Plate, Inc., Clearwater, Fla.

[21] Appl. No.: 406,199

[22] Filed: Aug. 9, 1982

Related U.S. Application Data

[62] Division of Ser. No. 197,073, Oct. 15, 1980, Pat. No. 4,371,422.

[51] Int. Cl.³ .............................................. B08B 3/02
[52] U.S. Cl. ...................................... 134/72; 134/104; 134/154; 134/199
[58] Field of Search ................. 134/72, 131, 104, 154, 134/182–183, 199

[56] References Cited

U.S. PATENT DOCUMENTS

| | | | |
|---|---|---|---|
| 2,579,575 | 12/1951 | Herdlein | 134/131 X |
| 4,231,806 | 11/1980 | Henry | 134/154 X |
| 4,338,958 | 7/1982 | Fujita | 134/199 X |

*Primary Examiner*—Robert L. Bleutge
*Attorney, Agent, or Firm*—Jack E. Dominik

[57] ABSTRACT

Disclosed is the continuous processing of flat workpieces such as printed circuit boards which are suspended by a hanger conveyorized for continuous horizontal transport. More specifically, the conveyorizing passes the workpieces through a plurality of chambers having slotted-end members, one such chamber spraying to remove the photoresist, and another such chamber spraying etching solution to remove the copper cladding. Each station has a slotted cover, and the conveyor suspends a plurality of workpiece holders, each of the holders being joined by chain links of an inert material which overlie the slot in the covers for the chambers. The photoresist chamber is provided with a continuous filter for continuously removing and filtering the sludge, thereby reducing the tendency of the removal solution to dilute and become ineffective. All of the chambers are modularized, and the system is compatible with continuous processing for the plating of the printed circuit boards.

13 Claims, 4 Drawing Figures

U.S. Patent    Jan. 24, 1984    Sheet 1 of 2    4,427,019
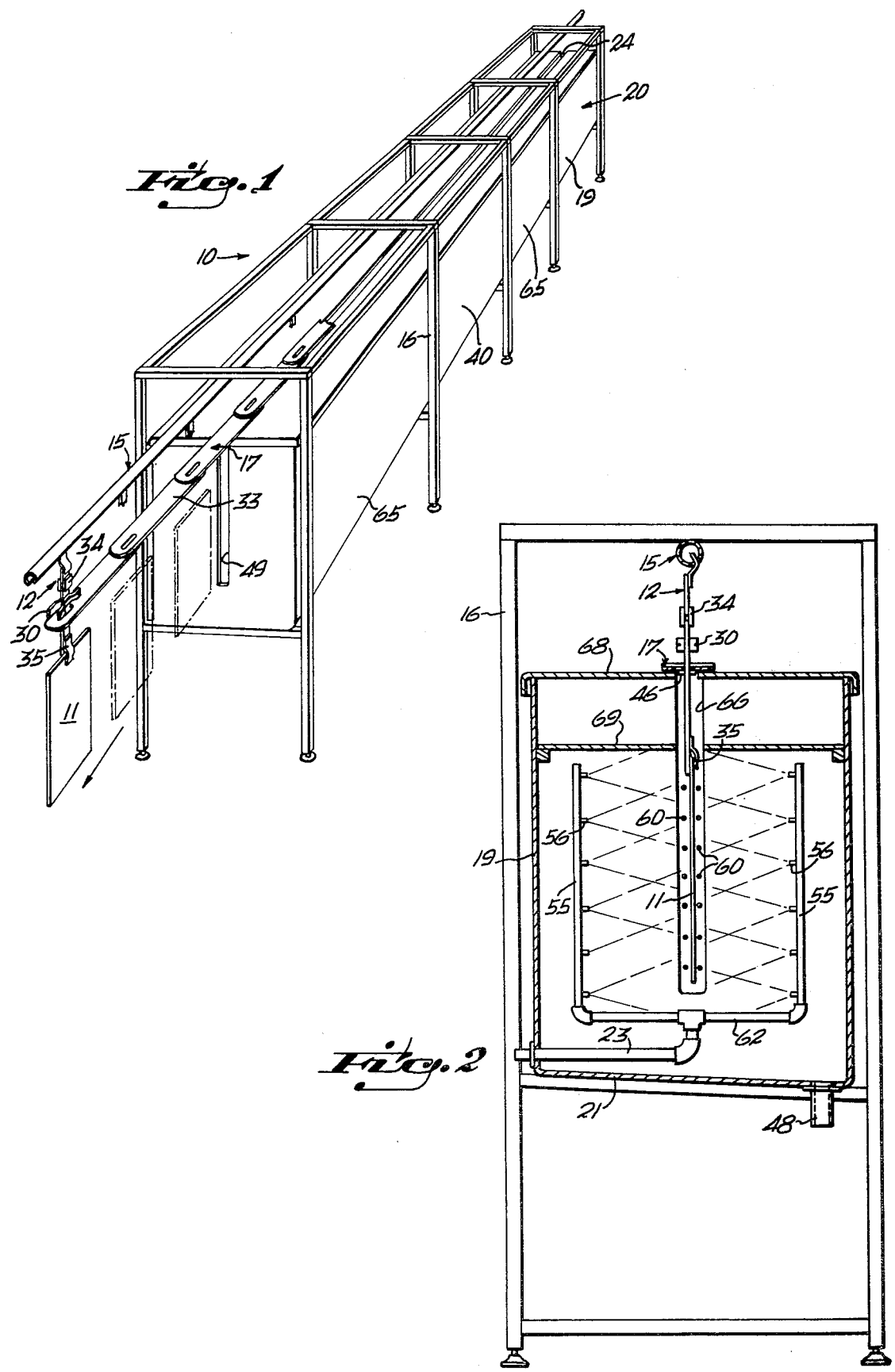

CHEMICAL PROCESS APPARATUS

This application is a divisional application of Ser. No. 197,073 filed Oct. 15, 1980, now U.S. Pat. No. 4,371,422.

FIELD OF INVENTION

The present invention is directed to apparatus for continually processing workpieces for stripping and etching chemical processing, such as but not limited to rinsing, developing, actuating, ovide treatment, and coating. More particularly, the invention finds utility in the processing of printed circuit boards, particularly prior to and after plating as well as for photoresist removal, developing photoresist, and etching metal resists.

SUMMARY OF THE PRIOR ART

Printed circuit boards, for electronic applications, are normally formed of a relatively inert material such as fiberglasss reinforced board. Initially using the common subtractive process they are clad, primarily with a thin coat of copper. This cladding is normally on both sides. Thereafter, in order to form the circuit, a photoresist is applied to one or both sides of the board. The photoresist is essentially inert to the plating processes, after being exposed to a circuit pattern and developed, it defines the pattern in the developed voids of the photoresist, which is the circuit to be plated. Thereafter the boards are electrically charged becoming a cathode, and placed in a solution carrying the metal to be deposited. Usually this is copper, tin lead, tin, nickel, or gold. After the metal has been deposited to the predetermined thickness, as in the case of copper, the boards are then rinsed and subsequently the plated portion is again plated with a tin lead. The tin lead covering is usually plated in essentially the same manner as the copper.

Subsequently the photoresist is removed, and the cladded copper layer is etched off the board. Remaining is the circuit which has been plated to the board covered with the tin lead which is an etch resist since it is not dissolved by the etchant. In some applications, the tin lead may be reflowed, or stripped (removed). In other applications it serves as a solderable surface for joining other electronic components to the printed circuit board.

The state of the art photoresist removers and cladding etch are horizontal conveyorized etching machines and stripping machines. Both require manual orientation before the processing, and thus are labor intensive. Also where the printed circuit board is oriented horizontally, the upper surface sees a pooling effect, while the lower surface must work against gravity. This results in a side-to-side difference between the photoresist removal and etching on both sides. In some instances, batch processing orients the printed circuit boards in a vertical plane, but this is seldom used.

SUMMARY

The present invention deals with the continuous processing of flat workpieces such as printed circuit boards which are suspended by a hanger conveyorized for continuous horizontal transport. More specifically, the conveyorizing passes the workpieces through a plurality of chambers having slotted end members, for instance one such chamber spraying to remove the photoresist, and another such chamber spraying etching solution to remove the copper cladding.

Each chamber has a slotted cover, and the conveyor suspends a plurality of workpieces holders, each of the holders being joined by a chain linked cover of an inert material which overlie the slot in the covers of the chambers. More specifically, the photoresist chamber is provided with a sludge filter conveyor for continuously removing photoresist material which has been stripped from the board and filtering the solution, thereby extending the life of the stripping solution since it need not dissolve the removed photoresist. All of the chambers are modularized, and the system is compatible with additional continuous processing such as the copper plating of the printed circuit boards.

The method of the present invention is essentially to provide for the continuous processing of printed circuit boards. The printed circuit boards are constrained against lateral sway by providing a plurality of wires extending along the path of motion.

One of the objects of the present invention is to provide a means for continuously processing the manufacture of printed circuit boards which is compatible with electroplating copper, tin lead, etc.

Still another object of the present invention is to provide for the continuous processing during horizontal transport in a vertical plane of printed circuit boards for such steps as photoresist removal, and etching of the copper cladding of the boards, developing photoresists, preplating and postplating chemical treatments, and other processing of the printed circuit boards during the manufacturing process.

Yet another object of the present invention is to provide for the processing of printed circuit boards in a manner which minimizes operator handling, thus maximizing the uniformity of control of quality.

Still another object of the present invention is to provide for the processing of printed circuit boards in an automated fashion which reduces the cost of manufacturing the printed circuit boards.

RELATED APPLICATIONS

This application relates to copending application Ser. No. 192,424, now U.S. Pat. No. 4,401,522, the inventors of which are Adolph G. Buschow and Charles D. Eidschun.

DESCRIPTION OF ILLUSTRATIVE DRAWINGS

Further objects and advantages of the present invention will become apparent as the following description takes place, taken in conjunction with the accompanying drawings, in which:

FIG. 1 is a perspective partially diagrammatic view of an apparatus embodying the subject matter of the present invention;

FIG. 2 is a partially diagrammatic cross-section taken through a chamber shown in FIG. 1 illustrating the modularization and common parts employed in the four processing chambers shown in FIG. 1;

DESCRIPTION OF ILLUSTRATIVE EMBODIMENT

Figure 3:
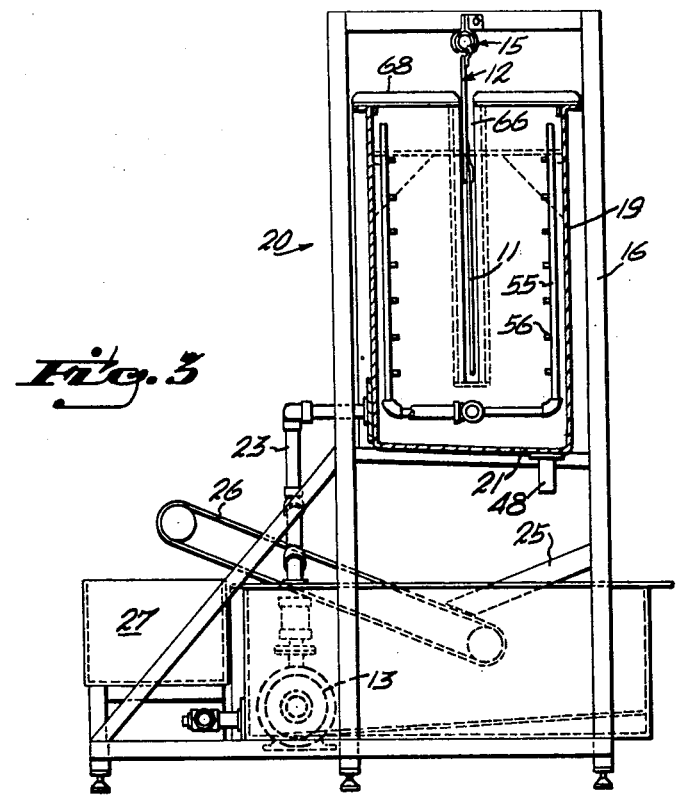
FIG. 3 is a transverse sectional view of a processing chamber which employs a sludge filter to remove photoresist from the resist strip solutions.

As noted in FIG. 1, the modular assembly 10 comprises four chambers which are aligned sequentially. A conveyor 15 is provided over all of the chambers, and a plurality of work hangers 12 suspend from the conveyor 15. The conveyor 15 is supported by the frame 16, as well as the processing tanks 19. Each work hanger 12 is joined to the adjacent work hanger 12 by means of chain plates 17. The work hangers are all provided with contact shoe assemblies 30, and a clip or hook 35 for securing the same to the printed circuit boards 11. An insulator 34 is provided above the contact shoe assembly 30, the contact shoe assembly 30 and insulator 34 being applicable primarily in those chambers where the printed circuit boards 11 are processed where the printed circuit board is activated as a cathode.

As shown in FIG. 1, the printed circuit boards 11 enter through the entry slot 24 in the end of the processing assembly 10. After passing through a chemical processing chamber 20, the printed circuit boards 11 enter into a rinse chamber 65. After all steps are completed the printed circuit boards 11 exit from exit slot 49.

Turning now to FIG. 2, it will be noted that the printed circuit boards 11 are guided by a plurality of wire guides 60, normally stainless steel wires covered with Teflon or other inert material, which are extended from end-to-end of the various process tanks 19 in a longitudinal fashion along the path of travel of the printed circuit boards 11. These wire guides 60 serve to constrain the printed circuit boards 11 where some non-uniformity may occur in the spray processing, and thus retain them in essentially a vertical configuration without damage to the product. In some applications the wire guides 60 are pitched downwardly, and in others are horizontal.

The tank 19 has a pitched bottom 21 leading to a drain 48. The solution supply lines 23 lead into a manifold 62 which in turn supply pressure fluid to the vertical spray tubes 55. The vertical spray tubes 55 have nozzles 56 which direct the fluid against the printed circuit boards 11.

Each tank 19 is provided with a cover 68, having a central slot 66. As further noted, the plastic chain links 17 are secured in place by means of link pins 46, the pins having a length slightly less than the width of the slot 66. The plastic link 17 thus overlie the slot 66 in the cover 68, and inhibit the passage of spray, fumes, contaminants, and the like into the ambient area. Optionally, a spray shelf 69 is provided immediately above the spray tubes 55. The spray shelf 69 also has a central slot to pass the work hanger 12 and the associated printed circuit board 11.

While the means for shielding has been shown and described the form of a plastic link 17 overlying the slot 66 and the cover 68, it will be appreciated that other means may be employed. For example, flexible wipers may be positioned and secured adjacent the slot 66 to overlap the same, and flexibly permit the passage of the work hanger 12 and its workpiece 11. Alternatively, a pair of longitudinal manifolds flanking on each side the central slot 66, and directing a flow of pressurized air down into the slot will significantly impede the passage of spray, fumes, contaminants and the like into the ambient air.

Figure 4:
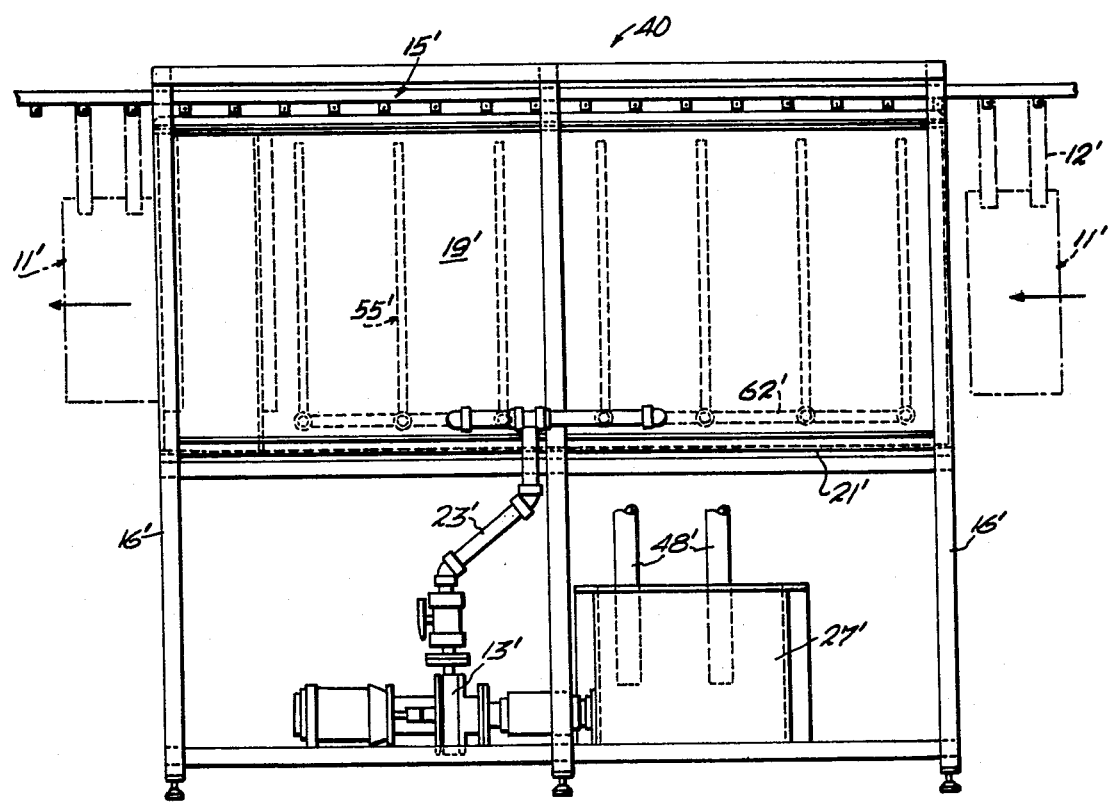
FIG. 4 is a longitudinal sectional view of a processing chamber.

As will become apparent in describing more specific the chemical process chambers in FIGS. 3 and 4 respectively, the elements just described with regard to FIG. 2 are essentially common to both units thus modularizing the entire assembly 10. For purposes of illustration, the FIG. 3 is considered to be the specific chemical process; photoresist removal. FIG. 4 is considered to be an etch process chamber, although it may not differ from other chemical process chamber such as developing. For purposes of illustration, each reference numeral in the etch chamber 40 will include a "prime" adjacent the reference numeral.

Noting now FIG. 3, it will be seen that the frame 16 supports the tank 19, and the tank bottom 21 is pitched so that fluid exits to the drain 48. Unique to the photoresist strip assembly 20 is the sludge chute 25 at the lower portion of the drain 48. The sludge filter 25 distributes the photoresist strip solution downwardly to a upwardly pitched sludge conveyor 26. The sludge conveyor 26 is a porous filter media, and permits the photoresist removal solution to drain into the reservoir 27, for recirculation by means of the solution pump 13 through the solution lines 23. At the end of the sludge conveyor 26 a sludge bucket 27 is provided, with further means for draining that portion of the sludge which did not drain while passing over the sludge conveyor 26. The sludge buckets 27 are removable and can be exchanged, when the sludge is disposed of as waste. By filtering the sludge over the sludge conveyor 26, and accomplishing the same at a steady continuous rate, the photoresist solution does not become contaminated or diluted to the extent it does in batch processing, and thus can be recirculated through the solution lines 23 for a significantly longer period of time than that experienced in the prior art.

The rinse chambers 65 are essentially the same as shown in FIGS. 2, 3 and 4 as well, but necessarily do not require a sludge chute 25, sludge conveyor 26, or sludge bucket 27. The rinse chambers 65 are employed normally after each chemical processing chamber such as photoresist removal 20 and copper etch 40.

The copper etch chamber 40 shown in FIG. 4 continues to employ the conveyor 15' and the tank 19' is supported by means of the frame 16'. The reservoir 27' is fed by means of the drains 48' which in turn are fed by the pitched bottom 21' of the tank 19'.

The spray tubes 55' are similarly provided with nozzles 56', and are fed by means of manifold 62' which, in turn, through the fluid pump 13' and solution lines 23' is constantly provided with pressure fluid for spraying the etch solution on the printed circuit boards 11'.

In many processes where continuous processing is employed, at certain chambers there is a maximum dwell time which can be tolerated, and at other chambers a minimum dwell time. The difference between the minimum and maximum is referred to here as a "process window". To accommodate this process window while maintaining a constant conveyor speed, rather than shortening the chamber of a modular unit which eliminates modularization and forces specialization, and to also maintain all other factors essentially constant, the spray tubes 55 and spray nozzles 56 are mounted to the manifold 62 in such a fashion that they can be rotated variably from the position of essentially perpendicular in the relationship to the workpiece, to 180° reversal whereupon the spray impinges upon the sidewall of the tank 19 and is essentially inactive. By reversing the flow, no changes in the spray rate or the spray pattern are involved at other stations than where the 180° reversal is undertaken. Furthermore, the provision is made to reverse the nozzle pattern at the entry portion to the chamber so that what little spray may rebound from the walls of the tank 19 is essentially ineffective on the product at the commencement of its entry into the chamber which is being controlled to, as just described, reduce the effective dwell time. Depending upon the processes employed, there is a desired longest effective dwell time and a desired shortest effective dwell time in the various chambers 20, 40, 65. There is also a fastest speed at which the conveyor 15 can operate, and yet still accommodate the longest effective dwell time in a given one of the chambers, presuming the chambers are all the same length. Therefore the speed of the conveyor is set by the longest effective dwell time. Where a given chamber is to have an effective dwell time shorter than the longest effective dwell time, then the spray tubes 55 and nozzles 56 are available to shorten the process effective dwell time by deactivating portions of the processing operation in the given processing chamber 20, 40, 65.

THE METHOD

The method for processing printed circuit boards 11 contemplates suspending the same by a work hanger 12 along a horizontal conveyor 15. A plurality of processing chambers 20, 40, 65 having slotted-end members pass the printed circuit boards along a horizontal path of travel in a vertical orientation. Each of the chambers 20, 40, 65 is provided with an interior plurality of opposed spray tubes 55. A slotted cover 68 having a slot 66 is also provided for each of the stations 20, 40, 65 and the work hangers 12 are secured each to the other by means of a inert chain link which is proportioned to overlie the slots 66 in the cover 68. The chambers are optionally positioned for photoresist first, or in multilayer applications for copper etch first; thereafter rinsing, and subsequently (depending on the process employed) either copper etch or photoresist removal. Upon exiting from the last chamber in accordance with the present invention the printed circuit boards are rinsed, ad then optionally air dried or blower dried in a conventional manner from a standpoint of the drying, but in accordance with the present invention based upon the unique method and apparatus for suspending and transporting the printed circuit boards 11.

The spray jets employed in both the photoresist removal and the etching are essentially of two types, the flat type and the cone type. Exemplary of the flat type are the Vee Jet nozzles type H-U and type U series distributed by Spraying Systems Co. of Wheaton, Ill. Typically the flat spray is a one-quarter inch H-U 5010. The full cone, sometimes referred to as "square spray pattern" is known as the Full Jet nozzles distributed by the same suppliers as the Vee Jet. One such model is the one-quarter inch HH 12 sq. In the accepted unit there are approximately ninety-six such jets. In the photoresist removal the jets first impinging upon the printed circuit boards are the cone or square spray type intended to soften and chemically penetrate the film. Near the end of the chamber the flat sprays are used with the pattern oriented vertically thus using the impact of the fluid to remove the film from the board as well as to creep in under the edge of the overplating of copper which may result from the earlier processing of the printed circuit board. Mixtures of the jets for a variable pattern at mid-portions of the processing are also employed. The jets at the top of the unit are the flat spray Vee Jet type oriented so that the pattern is horizontal. This causes a moisture barrier between the spray lower down in the tank to reduce tendency to overspray outside the equipment. It also serves to clean the racks which can be contaminated by the photoresist stripping solution as well as the etchant. In a typical eight foot stripping cell the flow rate of the stripping solution approximates two hundered gallons per minute. This is distributed over approximately ninety-six nozzles with nozzle pressures of 2 to 5 psi. In the cladding removal processing, a similar proportion and orientation as well as flow rates and pressures is employed. In the intermediate rinsing chambers, there are fewer jets, and the pattern is essentially uniform from the entrance to the exit of the rinsing chamber.

The above further reinforces the desirability of the chain plate cover for the various slots on the various chambers in minimizing spray outside of the equipment. Irrespective of whether photoresist stripping solution is employed, rinse, etching solution, or even a combination of the same the resulting contamination of the spray exiting from the processing tanks is significantly reduced if not virtually eliminated by the chain plate assembly.

Although particular embodiments of the invention have been shown and described in full here, there is no intention to thereby limit the invention to the details of such embodiments. On the contrary, the intention is to cover all modifications, alternatives, embodiments, usages and equivalents of the subject invention as fall within the spirit and scope of the invention, specification and the appended claims.

I claim:

1. A photoresist and etch modular unit for printed circuit boards comprising, in combination,
   a conveyor for horizontal transport of a plurality of printed circuit boards,
   a plurality of work hangers suspended from said conveyor,
   each of said work hangers having means at a lower portion thereof for removably securing and receiving a printed circuit board,
   a photoresist chamber having a slotted end portion for receiving the vertically suspended printed circuit board,
   a cover for the photoresist chamber having a slot at a center portion,
   means secured to sequential work hangers to overlie the cover slot for shielding the slot in the cover,
   and a plurality of additional chambers for processing the printed circuit boards all continuously aligned horizontally,
   whereby a plurality of printed circuit boards are continuously processed for removal of the photoresist and the cladding while oriented in a vertical plane.

2. In the modular unit of claim 1,
   a plurality of guides positioned interiorly of each of the chambers in opposed relationship,
   whereby the printed circuit boards are constrained against lateral movement while being processed by fluids interiorly of the chambers in the modular unit.

3. In the apparatus of claim 1,
   a photoresist sludge conveyor positioned for continuously filtering and removing suspended photoresist from the removal solution so that the removal solution can be recycled through the process.

4. In the apparatus of claim 2,
   a photoresist sludge conveyor positioned for continuously filtering and removing suspended photoresist from the removal solution so that the removal solution can be recycled through the process.

5. In the apparatus of claim 1, each of said work hangers being joined to an adjacent work hanger by a chain plate proportioned to overlie the slot in the cover.

6. A modular apparatus for processing printed circuit boards, comprising:
 (a) a conveyor for substantially horizontal transport;
 (b) a plurality of work hangers suspended from said conveyor, each of said hangers including means for vertically holding one of said printed circuit boards to be processed;
 (c) a plurlaity of chambers positioned beneath said conveyor, each of said chambers having a slot of dimensions to permit said vertically held printed circuit boards to pass completely into and exit from said chamber as they are transported by said conveyor;
 (d) said slots of width slightly greater than the thickness of both said hangers and holding means to minimize the escape through said slots of chemical spray within chambers; and
 (e) means for travelling with said work hangers for covering said chamber slot while permitting said printed circuit boards to be transported through said chambers.

7. The apparatus of claim 6, wherein:
 (a) each of said chambers includes a tank with slotted ends, a slotted cover, and a system of spray tubes;
 (b) said end slots and cover slots forming said slot; and
 (c) said system of spray tubes is for spraying a pressurized fluid against said printed circuit boards within said chamber.

8. The apparatus of claim 6, wherein each of said tanks is positioned adjacent another with the adjacent end slots in registration.

9. The apparatus of claim 6, further comprising a plurality of guides within at least one of said chambers for maintaining said printed circuit boards substantially vertical during said spraying.

10. The aparatus of claim 6, further comprising means for recycling and repressurizing said sprayed fluid in at least one of said chambers.

11. The apparatus of claim 6, further comprising a photoresist sludge conveyor for continuously filtering said sprayed fluid during said recyeling.

12. The apparatus of claim 6, wherein each of said spray tubes has an adjustable direction of spray so that an adjustable proportion of said pressurized fluid sprayed from said spray tube will miss all of said printed circuit boards.

13. A modular apparatus for processing printed circuit boards, comprising:
 (a) a conveyor for substantially horizontal transport;
 (b) a plurality of work hangers suspended from said conveyor, each of said hangers including means for vertically holding one of said printed circuit boards to be processed;
 (c) a plurality of chambers positioned beneath said conveyor, each of said chambers having a slot dimensioned to permit said vertically held printed circuit boards to pass completely into and exit from said chamber as the boards are transported by said conveyor;
 (d) each of said chambers includes a tank with slotted ends, a slotted cover, and a system of spray tubes;
 (e) said end slots and cover slot forming said slot;
 (f) said system of spray tubes is for spraying a pressurized fluid against said printed circuit boards within said chamber; and
 (g) said spray tubes have an adjustable direction of spray so that said spray tubes may be positioned to impinge in any direction between 90° and reversal 180° relative to such printed circuit boards to thereby selectively proportion the amount of fluid applied without changing the velocity or quantity in the system.

* * * * *